United States Patent
Ha et al.

(10) Patent No.: US 9,938,622 B2
(45) Date of Patent: Apr. 10, 2018

(54) METHOD TO DEPOSIT CVD RUTHENIUM

(71) Applicant: Applied Materials, Inc., Santa Clara, CA (US)

(72) Inventors: Tae Hong Ha, San Jose, CA (US); Sang Ho Yu, Cupertino, CA (US); Kiejin Park, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 234 days.

(21) Appl. No.: 15/045,667

(22) Filed: Feb. 17, 2016

(65) Prior Publication Data

US 2016/0160350 A1 Jun. 9, 2016

Related U.S. Application Data

(63) Continuation of application No. 13/968,197, filed on Aug. 15, 2013, now abandoned.
(Continued)

(51) Int. Cl.
  *C23C 16/06* (2006.01)
  *C23C 16/50* (2006.01)
  (Continued)

(52) U.S. Cl.
  CPC .......... *C23C 16/46* (2013.01); *C23C 16/0281* (2013.01); *C23C 16/16* (2013.01);
  (Continued)

(58) Field of Classification Search
  CPC ......... C23C 16/06; C23C 16/16; C23C 16/18; C23C 16/50
  See application file for complete search history.

(56) References Cited

U.S. PATENT DOCUMENTS

| 7,964,506 B1 | 6/2011 | Ponnuswamy et al. |
| 8,357,614 B2 | 1/2013 | Gatineau |

(Continued)

FOREIGN PATENT DOCUMENTS

| KR | 2002-0057377 A | 7/2002 |
| TW | 200509303 A | 3/2005 |
| TW | 200702476 A | 1/2007 |

OTHER PUBLICATIONS

Dey, Sandwip K., et al., "Ruthenium films by digital chemical vapor deposition: Selectivity, nanostructure, and work function". Applied Physics Letters, vol. 84, No. 9, Mar. 1, 2004, pp. 1606-1608.*
(Continued)

*Primary Examiner* — Bret P Chen
(74) *Attorney, Agent, or Firm* — Patterson + Sheridan LLP

(57) ABSTRACT

Methods for depositing ruthenium by a PECVD process are described herein. Methods for depositing ruthenium can include positioning a substrate in a processing chamber, the substrate having a barrier layer formed thereon, heating and maintaining the substrate at a first temperature, flowing a first deposition gas into a processing chamber, the first deposition gas comprising a ruthenium containing precursor, generating a plasma from the first deposition gas to deposit a first ruthenium layer over the barrier layer, flowing a second deposition gas into the processing chamber to deposit a second ruthenium layer over the first ruthenium layer, the second deposition gas comprising a ruthenium containing precursor, depositing a copper seed layer over the second ruthenium layer and annealing the substrate at a second temperature.

20 Claims, 2 Drawing Sheets

Related U.S. Application Data

(60) Provisional application No. 61/724,799, filed on Nov. 9, 2012.

(51) Int. Cl.

| | | |
|---|---|---|
| *C23C 16/46* | (2006.01) | |
| *C23C 16/505* | (2006.01) | |
| *C23C 16/02* | (2006.01) | |
| *C23C 16/16* | (2006.01) | |
| *C23C 16/18* | (2006.01) | |
| *C23C 28/00* | (2006.01) | |
| *H01L 21/285* | (2006.01) | |
| *H01L 21/768* | (2006.01) | |
| *C23C 16/513* | (2006.01) | |

(52) U.S. Cl.
CPC ............ *C23C 16/18* (2013.01); *C23C 16/505* (2013.01); *C23C 16/513* (2013.01); *C23C 28/322* (2013.01); *C23C 28/34* (2013.01); *H01L 21/28556* (2013.01); *H01L 21/76841* (2013.01); *H01L 21/76873* (2013.01); *H01L 2221/1089* (2013.01)

(56) References Cited

U.S. PATENT DOCUMENTS

| | | | |
|---|---|---|---|
| 2002/0064592 A1 | 5/2002 | Datta et al. | |
| 2004/0105934 A1* | 6/2004 | Chang | B82Y 30/00 |
| | | | 427/255.28 |
| 2006/0153973 A1 | 7/2006 | Chang et al. | |
| 2006/0211228 A1 | 9/2006 | Matsuda | |
| 2007/0007241 A1 | 1/2007 | DeLouise | |
| 2007/0054487 A1 | 3/2007 | Ma et al. | |
| 2007/0099422 A1* | 5/2007 | Wijekoon | C23C 18/165 |
| | | | 438/687 |
| 2008/0099340 A1 | 5/2008 | Kanda et al. | |
| 2008/0105652 A1 | 5/2008 | Brusic et al. | |
| 2008/0296768 A1 | 12/2008 | Chebiam et al. | |
| 2009/0226611 A1 | 9/2009 | Suzuki et al. | |
| 2010/0075496 A1 | 3/2010 | Chen et al. | |
| 2010/0116738 A1* | 5/2010 | Xia | B01D 15/00 |
| | | | 210/638 |
| 2010/0182710 A1* | 7/2010 | Dinger | B82Y 10/00 |
| | | | 359/883 |
| 2010/0227476 A1 | 9/2010 | Peck | |
| 2011/0027977 A1* | 2/2011 | Li | C23C 16/0281 |
| | | | 438/584 |
| 2012/0012465 A1 | 1/2012 | Kim et al. | |

OTHER PUBLICATIONS

Han, Jeong Hwan, et al., "Chemical Vapor Deposition of Ru Thin Films with an Enhanced Morphology, Thermal Stability, and Electrical Properties Using a RuO4 Precursor". Chem. Mater. 2009, 21, 207-209.*

Choi, Young Chul, et al., "Properties of Ru and RuO2 Thin Films Prepared by Metalorganic Chemical Vapor Deposition". Jpn. J. Appl. Phys. vol. 38 (1999) pp. 4876-4880.*

Liao, Wen, et al., "Effect of CO on Ru Nucleation and Ultra-Smooth Thin Film Growth by Chemical Vapor Deposition at Low Temperature". Chem. Mater. 2013, 25, 1793-1799.*

Search Report for Taiwan Application No. 102132221 dated Feb. 9, 2017.

International Search Report dated Nov. 15, 2013 for related application; PCT/US2013/057060.

Office Action for U.S. Appl. No. 13/968,197 (APPM/017907US) dated Mar. 12, 2015.

Final Office Action for U.S. Appl. No. 13/968,197 (APPM/017907US) dated Sep. 24, 2015.

Vasilyev, V. Yu., et al., "Low-Temperature Pulsed CVD of Thin Layers of Metallic Ruthenium for Microelectronics and; Nanoelectronics. Part 3: Nucleation Phenomena during the Growth of Ruthenium Layers". Russian Microelectronics, 2010,; vol. 39, No. 4, pp. 262-272.

Damayanti, M., et al., "Ruthenium Barrier/Seed Layer for Cu/Low-k Metallization Crystallographic Texture, Roughness,; Diffusion, and Adhesion". Journal of The Electrochemical Society, 153 (6) J41-J45 (2006).

* cited by examiner

METHOD TO DEPOSIT CVD RUTHENIUM

CROSS-REFERENCE TO RELATED APPLICATIONS

This application is a continuation of U.S. patent application Ser. No. 13/968,197, filed on Aug. 15, 2013, now abandoned, which claims benefit of U.S. provisional patent application Ser. No. 61/724,799, filed Nov. 9, 2012, all of which are incorporated by reference in their entirety therein.

BACKGROUND OF THE INVENTION

Field of the Invention

Technology described herein generally relates to deposition of metals by PECVD. Specifically, technology described herein generally relates to methods of depositing ruthenium and avoiding corrosion on an underlying layer.

Description of the Related Art

Ruthenium (Ru) has been considered for decades as a candidate material for copper (Cu) metallization for its excellent properties of copper seed enhancement, resistance to oxidation. The wetting properties that ruthenium metallization provides to Cu, especially when feature sizes gets smaller, is of particular importance.

Chemical Vapor Deposition (CVD) has been a main approach to deposit ruthenium. CVD is well known in the art to provide better control of film morphology and step coverage over other methods, such as Physical Vapor Deposition (PVD). These benefits are increasingly important as feature move below the 35 nm range. Despite many superior aspects of CVD methods generally, prior techniques have not been successful at depositing ruthenium on certain underlying layers, such as copper layers.

CVD deposition of ruthenium on copper seed layers causes void formation in underlying copper layers as the layer is exposed to the ruthenium precursor and the deposited ruthenium. This phenomenon happens during the deposition step of ruthenium and is generally observed as ulcerations in the underlying copper materials. Stated another way, when ruthenium is deposited on top of copper or thin barriers including Ta or TaN, voids typically form in the copper layer exposed to the CVD ruthenium process either during deposition or during the $H_2$ annealing step followed by deposition. Others have worked around this problem by depositing a thicker copper seed layer prior to ruthenium CVD. However, thicker layers create scaling problems for features below 40 nm.

Thus, there is a need in the art for depositing ruthenium on thin metals layers to achieve the benefits of ruthenium without the deleterious effects described above.

SUMMARY OF THE INVENTION

Embodiments described herein generally relate to methods of CVD deposition of ruthenium. In one embodiment, a method for depositing ruthenium can include positioning a substrate in a processing chamber, the substrate having a barrier layer formed thereon; heating and maintaining the substrate at a first temperature; flowing a first deposition gas into a processing chamber, the first deposition gas comprising a ruthenium containing precursor; generating a plasma from the first deposition gas to deposit a first ruthenium layer over the barrier layer; flowing a second deposition gas into the processing chamber to deposit a second ruthenium layer over the first ruthenium layer, the second deposition gas comprising a ruthenium containing precursor; depositing a copper seed layer over the second ruthenium layer; and annealing the substrate at a second temperature.

In another embodiment, a method for depositing ruthenium can include positioning a substrate in a processing chamber; forming a barrier layer on the surface of the substrate; heating and maintaining the substrate at a first temperature; flowing a deposition gas into a processing chamber, the deposition gas comprising a ruthenium-containing precursor; generating a plasma from the deposition gas to deposit a ruthenium layer over the barrier layer; depositing a copper seed layer over the ruthenium layer; and annealing the substrate at a second temperature.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings.

It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Methods of depositing ruthenium without damaging underlying layers are described herein. Conformal ruthenium (Ru) deposition over a barrier layer, such as can be achieved by chemical vapor deposition (CVD), provides a number of benefits, such as increasing wetting properties. During standard deposition of ruthenium, an undesirable level of carbon becomes incorporated into the ruthenium layer. Carbon can, among other things, interfere with the reflow of the subsequently deposited copper (Cu) layer. Carbon is generally removed from the layer by an $H_2$ anneal. However, the $H_2$ anneal creates corrosion in underlying layers, such as copper layers, which reside under the barrier layer. In the prior art, this is avoided by having a very thick ruthenium layer prior to $H_2$ annealing. As feature sizes become smaller, however, the size of the ruthenium layer becomes increasingly important.

The methods described herein overcome this limitation in the prior art. By depositing the barrier layer and forming a thin ruthenium layer by plasma enhanced CVD (PECVD). By PECVD depositing ruthenium to create a layer of between 5 Å and 7 Å, the ruthenium can be deposited with only limited amounts of carbon remaining. Thus, the $H_2$ anneal step can be excluded. A copper seed layer is then deposited by physical vapor deposition (PVD). The copper seed layer is annealed to flow the copper over the ruthenium layer conformally. This step prepares the copper seed layer for subsequent copper electrochemical plating (ECP). The invention disclosed herein is more clearly described with reference to the figures below.

Figure 1A:
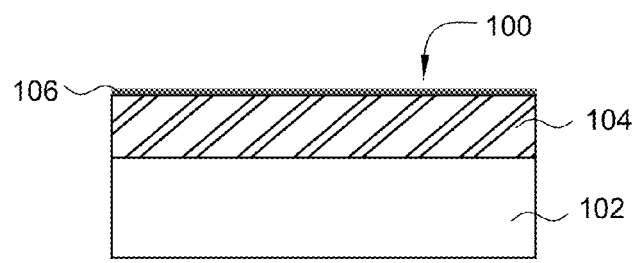
FIG. 1A-1C is a graphical representation of the composition including an underlying copper layer and a ruthenium layer according to one embodiment.
Figure 1B:
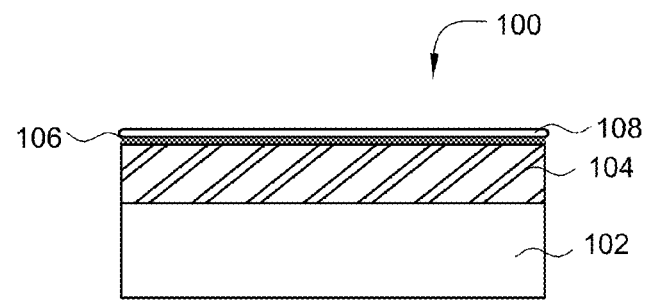
Figure 1C:
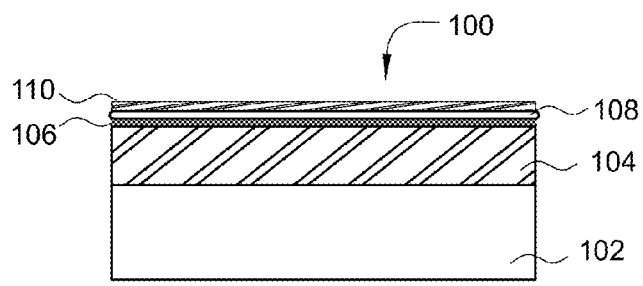

FIG. 1A-1C depicts a PECVD deposition of an organo-ruthenium compound according to one embodiment. FIG. 1A is a composition 100 with a barrier layer 106 formed thereon. The composition 100 includes a substrate 102. The substrate 102 can be of any composition, such as a crystalline silicon substrate. The substrate 102 can also include one or more features (not shown), such as a via or an interconnect. The substrate surface may have a copper layer 104 formed thereon.

A "substrate surface", as used herein, refers to any substrate or material surface formed on a substrate upon which a layer can be deposited. For example, a substrate surface on which layer can be deposited includes materials such as silicon, silicon oxide, silicon nitride, doped silicon, germanium, gallium arsenide, glass, sapphire, and any other materials such as metals, metal nitrides, metal alloys, and other conductive materials, depending on the application. A substrate surface may also include dielectric materials such as silicon dioxide and carbon doped silicon oxides. Substrates may have various dimensions, such as 200 mm or 300 mm diameter wafers, as well as rectangular or square panes.

The copper layer 104 can subsequently have a barrier layer 106 formed thereon. The barrier layer can comprise any known barrier layer material, such as tantalum/tantalum nitride (Ta/TaN) or titanium/titanium nitride (Ti/TiN). The barrier layer 106 can be preferentially Ta/TaN. The barrier layer 106 can have a thickness of from 10 Å to 50 Å.

In FIG. 1B, a ruthenium layer 108 is deposited over the surface of the barrier layer 106. The substrate 102 has the copper layer 104 deposited on the substrate surface and the barrier layer 106 deposited on the copper layer 104. The ruthenium layer 108 is deposited by a PECVD process over the surface of the barrier layer. The ruthenium layer 108 can be between 3 Å and 7 Å thick, such as a ruthenium layer that is 5 Å thick. Further, it is important to note is that the deposited ruthenium layer 108 contains very little carbon, as carbon is known to affect reflow of copper in subsequent deposition.

In one embodiment, ruthenium is deposited by CVD on top of the ruthenium layer 108. The ruthenium CVD layer (not shown) can be between 10 Å and 45 Å thick. The underlying ruthenium layer 108 prevents further processing from affecting the underlying copper layer 104 or barrier layer 106, thus avoiding void formation or other types of corrosion.

FIG. 1C depicts a copper seed layer 110 deposited over the ruthenium layer 108. The copper seed layer 110 is generally deposited by PVD over the surface of the ruthenium layer 108. The copper seed layer 110 is reflowed using an annealing process which creates a more conformal layer over the surface of the ruthenium layer 108. The copper seed layer 110 can subsequently seed copper deposition by a standard ECP process.

Figure 2:
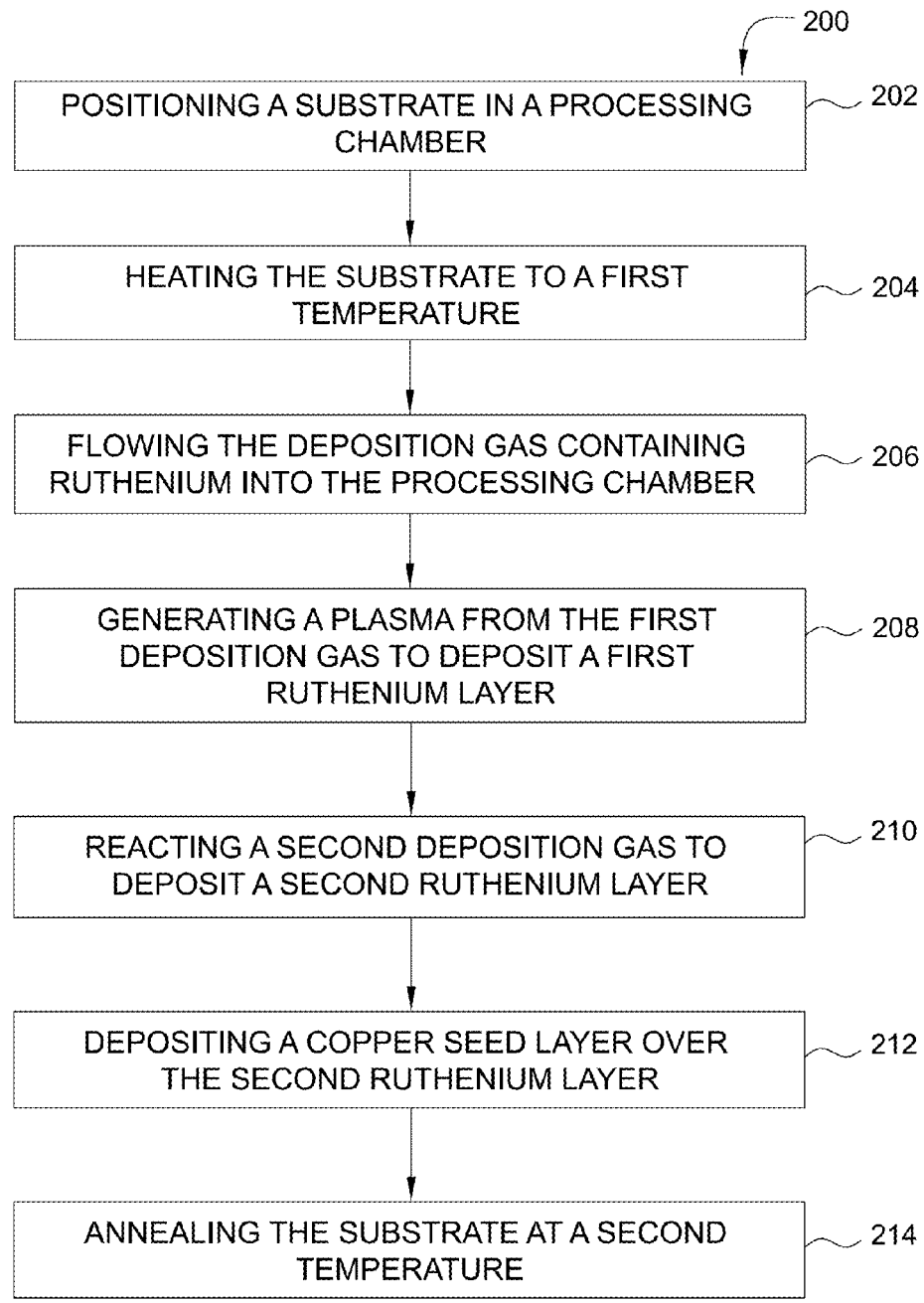
FIG. 2 is a diagram of a method for forming a ruthenium layer according to one embodiment.

FIG. 2 is a diagram of a method 200 for forming a ruthenium layer according to one embodiment. The method 200 can include positioning a substrate in a processing chamber, as in 202. The substrate can be of any composition described above, such as a crystalline silicon substrate. The substrate may have one or more features formed on the surface, such as a via or an interconnect. Further, the substrate may have one or more copper components deposited on the surface, such as a via which is filled with copper as part of a dual damascene process. The substrate may also have a barrier layer formed over both the surface of the substrate and any exposed components. In one embodiment, a Ta/TaN layer is formed over the surface of the substrate. The Ta/TaN layer may further comprise dopants, such as cobalt or aluminum. The Ta/TaN layer can have a thickness of from 10 Å to 50 Å, based on the needs and requirements of the device being formed. In further embodiments, this layer may be formed as a step of the method described herein.

The method 200 can include heating a substrate to a first temperature, as in 204. After positioning the substrate, the substrate can be heated to a first temperature. The substrate can be heated by one or more means, such as a heating element embedded into the substrate support. In one or more embodiments, the substrate is heated to a temperature between 150° C. and 350° C.

The method 200 can include flowing a deposition gas containing ruthenium into the processing chamber, as in 206. After the substrate is heated, the deposition gas containing ruthenium can be flowed into the chamber. The deposition gas can contain a ruthenium containing gas. The most common ruthenium containing gases utilized are $Ru(C_5H_5)_2$ (bis(cyclopentadienyl)ruthenium), $Ru_3(CO)_{12}$ (dodecacarbonyl triruthenium), or their derivatives such as ethyl Ru(Et-$C_5H_4)_2$ or $(C_5H_4)Ru(CO)_3$. The ruthenium containing gas can be an organoruthenium gas. The organo-ruthenium gas can be of the generic formula $Ru(X)_2Y$, wherein X is an aldehyde (CHO) and Y is either an aldehyde or a phenyl group.

The deposition gas can further contain an inert gas, such as a noble gas, for forming the plasma or as a carrier gas for the ruthenium. The deposition gas should be delivered in a pressure range of between 10 mTorr and 100 Torr.

The method 200 can include generating a plasma from the first processing gas to deposit a first ruthenium layer, as in 208. A plasma is formed in the presence of the deposition gas to activate the deposition gas. Hydrogen ($H_2$), argon (Ar), nitrogen ($N_2$) or helium (He) can be used to generate the plasma inside the chamber. The power source for the plasma can be an RF power source. Further it is contemplated that other plasma sources may be used with embodiments of the present invention. The RF power can be a frequency from 2 MHz to 60 MHz.

The activated gas will then deposit a ruthenium layer on the surface of the substrate. The ruthenium layer created in the presence of the plasma will be deposited with is between 3 Å and 7 Å. This thickness is believed to be important to preventing the corrosion without interfering with subsequent layer formation.

Without intending to be bound by theory, most of the deposited ruthenium is neutral in charge, but some of the deposited ruthenium from a standard CVD process is in an excited state. When there is some charge variance between the ruthenium molecules and underlying copper, the ruthenium abstracts electrons from the copper. The ruthenium has a high electron affinity. After the electrons are abstracted by the charged ruthenium, the copper becomes ionized. The ionized copper may then react with the hydrogen from the annealing process to create volatile compounds from the corer, such as copper hydroxide. The volatile compounds then evaporate from the surface of the copper which is beneath the ruthenium layer, thus creating holes in the copper.

The method 200 can include reacting a second deposition gas to deposit a second ruthenium layer, as in 210. At this point, the second ruthenium layer can then be deposited on the first ruthenium layer by a standard CVD process. The deposition gas used in this portion can be the same or different from the processing gas used depositing the first ruthenium layer. The deposition gas can comprise a ruthenium containing gas as described above. The deposition gas can further include a carrier gas, thus controlling pressure, flow rate and concentration of the reactants independently. The deposited ruthenium layer by CVD can be between 10 Å and 45 Å. In another embodiment, the deposited ruthenium layer can be by a PECVD process, such as the one described above.

The method 200 can include depositing a copper seed layer over the second ruthenium layer, as in 212. After the ruthenium layers are deposited, a copper seed layer can be deposited over the ruthenium layer. The copper seed layer can be deposited by a PVD process. In this process, a copper target would be sputtered in the presence of a plasma comprising an inert gas, such as argon. The sputtered copper would then land on the surface of the ruthenium layer forming a copper seed layer.

The method 200 can include annealing the substrate at a second temperature, as in 214. The sputtered copper from the previous step will largely cover the surface. However, due to the nature of PVD, as compared to CVD, the copper should be reflowed to provide a more conformal layer. The substrate is heated to a second temperature. The second temperature is a temperature which will allow the copper to at least partially liquefy and flow over the surface of the ruthenium. Ruthenium allows for high wetting from the flowed copper, thus spreading the seed layer over the surface. During the anneal process, the copper layer can then flow into vias and trenches having high aspect ratios where initial deposition by PVD would have been difficult. After the seed layer is flowed, copper can be deposited from the copper seed layer by standard ECP techniques to create a conformal copper layer over the surface of the substrate.

CONCLUSION

Embodiments described herein relate to methods of depositing ruthenium over a barrier layer while avoiding void formation in underlying copper layers. Ruthenium has long been considered as a candidate material for copper metallization. In prior art methods of depositing ruthenium, the ruthenium deposited by CVD either had an unacceptably high level of carbon in the layer, thus preventing proper reflow of the copper layer, or the deposition process led to damage in underlying copper layers. The damage to underlying layers generally occurred after the $H_2$ anneal step, which was necessary in prior art techniques to remove carbon. By depositing the ruthenium over the barrier layer using the described PECVD process, the ruthenium can be deposited conformally without incorporating significant amounts of carbon. As the carbon is largely absent from the deposited ruthenium layer, the H2 anneal is unnecessary and the layer allows for proper reflow of the copper seed layer for further processing.

While the foregoing is directed to embodiments of the present invention, other and further embodiments of the invention may be devised without departing from the basic scope thereof, and the scope thereof is determined by the claims that follow.

What is claimed is:

1. A method for depositing ruthenium, comprising:
heating and maintaining a substrate at a first temperature in a processing chamber, wherein the substrate has a barrier layer formed thereon;
flowing a first deposition gas into the processing chamber to deposit a first ruthenium layer on the barrier layer using a first chemical vapor deposition method, wherein the first deposition gas is selected from the group consisting of $Ru(C_5H_5)_2$ (bis(cyclopentadienyl)ruthenium), $Ru_3(CO)_{12}$ (dodecacarbonyl triruthenium), and combinations thereof; and
flowing a second deposition gas into the processing chamber to deposit a second ruthenium layer on the first ruthenium layer using a second chemical vapor deposition method that is different from the first chemical vapor deposition method, wherein the second deposition gas is selected from the group consisting of $Ru(C_5H_5)_2$ (bis(cyclopentadienyl)ruthenium), $Ru_3(CO)_{12}$ (dodecacarbonyl triruthenium), and combinations thereof, and the second deposition gas is different from the first deposition gas.

2. The method of claim 1, wherein the first chemical vapor deposition method is a plasma-enhanced chemical vapor deposition (PECVD) method and the second chemical vapor deposition method is performed in a plasma-free environment.

3. The method of claim 1, wherein the first temperature is between 150° C. and 350° C.

4. The method of claim 1, wherein the first ruthenium layer is from 3 Å to 7 Å thick.

5. The method of claim 1, wherein the second ruthenium layer is from 10 Å to 45 Å thick.

6. The method of claim 1, wherein the barrier layer comprises tantalum (Ta) and tantalum nitride (TaN).

7. The method of claim 1, wherein the barrier layer has one or more copper features formed underneath.

8. The method of claim 1, wherein the first deposition gas further comprises $H_2$, $NH_3$, Ar, $N_2$, He or combinations thereof.

9. A method for depositing ruthenium, comprising:
heating and maintaining a substrate at a first temperature in a processing chamber, wherein the substrate has a barrier layer formed thereon;
flowing a first deposition gas into the processing chamber, the first deposition gas is selected from the group consisting of $Ru(C_5H_5)_2$ (bis(cyclopentadienyl)ruthenium), $Ru_3(CO)_{12}$ (dodecacarbonyl triruthenium), and combinations thereof;
generating a plasma from the first deposition gas to deposit a first ruthenium layer over the barrier layer;
flowing a second deposition gas into the processing chamber to deposit a second ruthenium layer on the first ruthenium layer by a chemical vapor deposition (CVD) method in a plasma-free environment, wherein the second deposition gas is selected from the group consisting of $Ru(C_5H_5)_2$ (bis(cyclopentadienyl)ruthenium), $Ru_3(CO)_{12}$ (dodecacarbonyl triruthenium), and combinations thereof, and the second deposition gas is different from the first deposition gas;
depositing a copper seed layer over the second ruthenium layer; and
annealing the substrate at a second temperature.

10. The method of claim 9, wherein the first temperature is between 150° C. and 350° C.

11. The method of claim 9, wherein the first deposition gas further comprises $H_2$, $NH_3$, Ar, $N_2$, He or combinations thereof.

12. The method of claim 9, wherein the first ruthenium layer is from 3 Å to 7 Å thick.

13. The method of claim 9, wherein the second ruthenium layer is from 10 Å to 52 Å thick.

14. The method of claim 9, wherein the plasma is generated from an RF source with a power between 50 W and 1000 W.

15. The method of claim 9, wherein the barrier layer comprises tantalum (Ta) and tantalum nitride (TaN).

16. A method for depositing ruthenium, comprising:

heating a substrate in a processing chamber, the substrate having a barrier layer formed thereon;

depositing a first ruthenium layer on the barrier layer from a first deposition gas using a first chemical vapor deposition method, wherein the first deposition gas is selected from the group consisting of $Ru(C_5H_5)_2$ (bis(cyclopentadienyl)ruthenium), $Ru_3(CO)_{12}$ (dodecacarbonyl triruthenium), and combinations thereof;

depositing a second ruthenium layer on the first ruthenium layer from a second deposition gas using a second chemical vapor deposition method in a plasma-free environment, wherein the second deposition gas is selected from the group consisting of $Ru(C_5H_5)_2$ (bis(cyclopentadienyl)ruthenium), $Ru_3(CO)_{12}$ (dodecacarbonyl triruthenium), and combinations thereof, and the second deposition gas is different from the first deposition gas;

depositing a copper layer on the second ruthenium layer; and annealing the substrate.

17. The method of claim 16, wherein the first chemical vapor deposition method is a plasma-enhanced chemical vapor deposition (PECVD) method.

18. The method of claim 17, wherein the PECVD method uses an RF source with a power between 50 W and 1000 W.

19. The method of claim 16, wherein the first ruthenium layer is from 3 Å to 7 Å thick.

20. The method of claim 16, wherein the second ruthenium layer is from 10 Å to 45 Å thick.

* * * * *